US012727191B2

(12) United States Patent
Parkin et al.

(10) Patent No.: US 12,727,191 B2
(45) Date of Patent: Sep. 1, 2026

(54) MULTIPLE FIN HEIGHTS FOR EFFECTIVE WIDTH TUNING

(71) Applicant: International Business Machines Corporation, Armonk, NY (US)

(72) Inventors: William Murphy Parkin, Troy, NY (US); Susan Ng Emans, Albany, NY (US); Julien Frougier, Albany, NY (US); Ruilong Xie, Niskayuna, NY (US); Andrew M. Greene, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 362 days.

(21) Appl. No.: 18/536,975

(22) Filed: Dec. 12, 2023

(65) Prior Publication Data

US 2025/0194140 A1 Jun. 12, 2025

(51) Int. Cl.

| | |
|---|---|
| ***H10D 30/62*** | (2025.01) |
| ***H10D 30/01*** | (2025.01) |
| ***H10D 30/67*** | (2025.01) |
| ***H10D 30/69*** | (2025.01) |
| ***H10D 62/13*** | (2025.01) |
| ***H10D 64/01*** | (2025.01) |

(52) U.S. Cl.

CPC ........... *H10D 30/62* (2025.01); *H10D 30/024* (2025.01); *H10D 30/6757* (2025.01); *H10D 30/795* (2025.01); *H10D 62/151* (2025.01); *H10D 64/017* (2025.01)

(58) Field of Classification Search

CPC .. H10D 30/62; H10D 30/024; H10D 30/6757; H10D 30/795; H10D 62/151; H10D 64/017; H10D 84/0158; H10D 84/0193; H10D 84/853

See application file for complete search history.

(56) References Cited

U.S. PATENT DOCUMENTS

| | | | | |
|---|---|---|---|---|
| 6,909,147 | B2 | 6/2005 | Aller et al. | |
| 7,612,405 | B2 | 11/2009 | Yu et al. | |
| 7,638,843 | B2 * | 12/2009 | Xiong .................. | H10D 86/011 257/401 |
| 8,106,459 | B2 | 1/2012 | Chang et al. | |
| 8,460,984 | B2 | 6/2013 | Wahl et al. | |
| 8,748,993 | B2 | 6/2014 | Lee et al. | |
| 9,048,259 | B2 | 6/2015 | Hung et al. | |

(Continued)

*Primary Examiner* — Jonathan Han

(74) *Attorney, Agent, or Firm* — CANTOR COLBURN LLP; Kimberly Zillig

(57) ABSTRACT

Embodiments of the present disclosure are directed to co-integrating multiple fin heights with bottom dielectric isolations for effective width tuning. In a non-limiting embodiment, a semiconductor structure includes a first shallow trench isolation (STI) region formed over a first portion of a substrate and a second STI region formed over a second portion of the substrate. A topmost surface of the second STI region is coplanar to a topmost surface of the first STI region. A first fin is formed in the first STI region and a second fin is formed in the second STI region. A topmost surface of the second fin is coplanar to a topmost surface of the first fin. A bottom dielectric isolation (BDI) region is positioned between the first fin and the substrate, thereby providing a first effective width and a second effective width for the first fin and second fin, respectively.

24 Claims, 13 Drawing Sheets

(56) References Cited

U.S. PATENT DOCUMENTS

| | | | | |
|---|---|---|---|---|
| 9,184,087 | B2 | 11/2015 | Chiang et al. | |
| 9,269,815 | B2 | 2/2016 | Cai et al. | |
| 9,287,385 | B2 | 3/2016 | Liu et al. | |
| 9,472,672 | B2 | 10/2016 | Lin et al. | |
| 9,711,412 | B2 | 7/2017 | Lee et al. | |
| 9,735,042 | B2 | 8/2017 | Hung et al. | |
| 10,068,810 | B1 | 9/2018 | Wu et al. | |
| 10,541,253 | B2 | 1/2020 | Cheng et al. | |
| 10,804,136 | B2 | 10/2020 | Cheng et al. | |
| 11,469,144 | B2 | 10/2022 | Chiang et al. | |
| 2007/0108528 | A1* | 5/2007 | Anderson .............. | H10B 10/00<br>257/365 |
| 2022/0231020 | A1* | 7/2022 | Frougier .............. | H10D 64/017 |

* cited by examiner

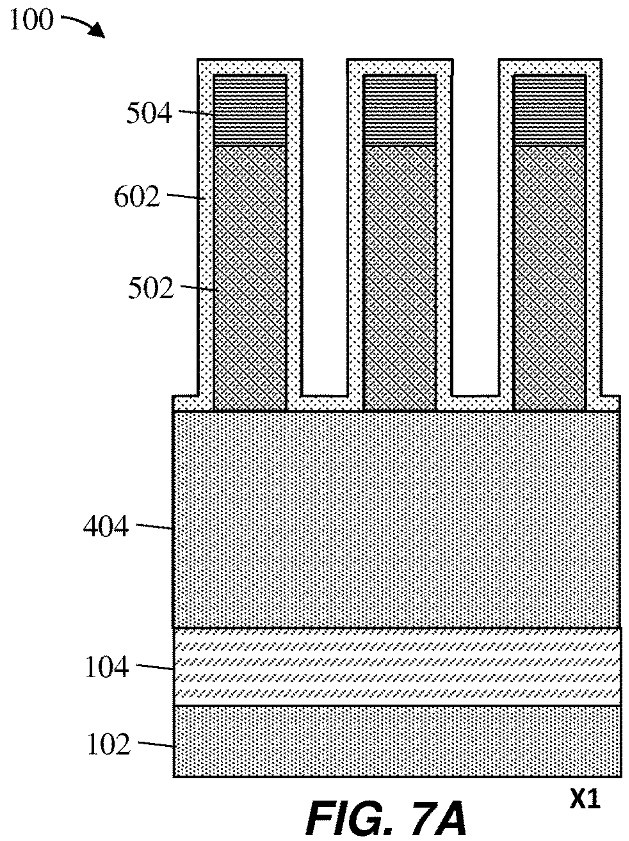
FIG. 7A X1
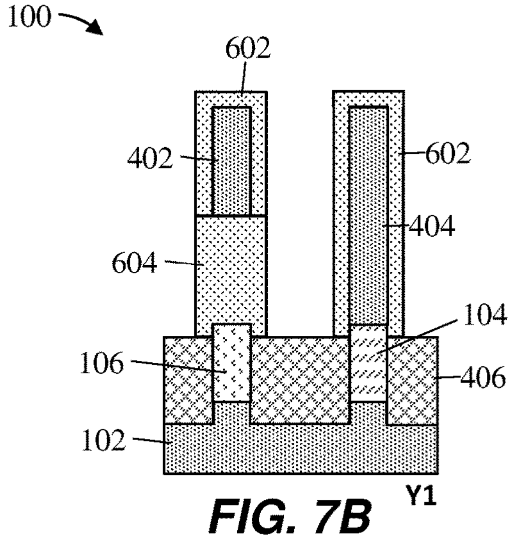
FIG. 7B Y1
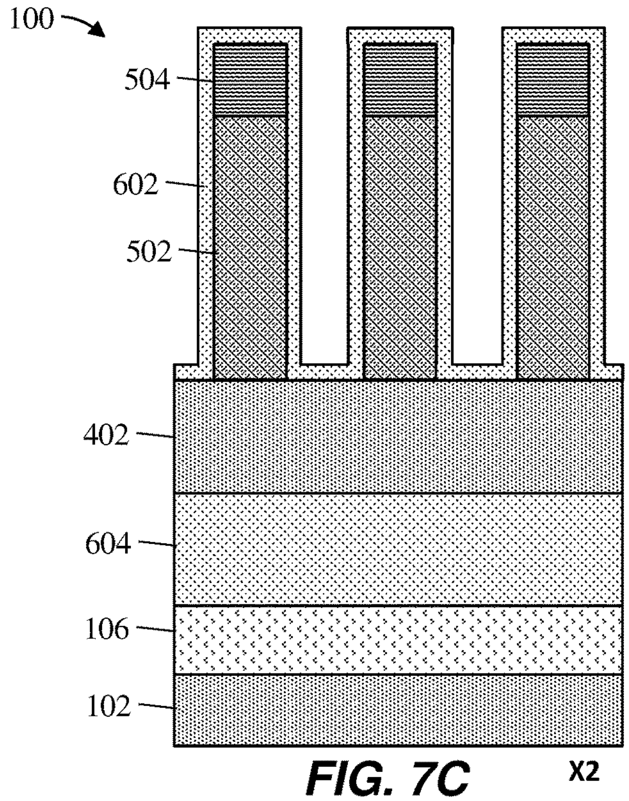
FIG. 7C X2
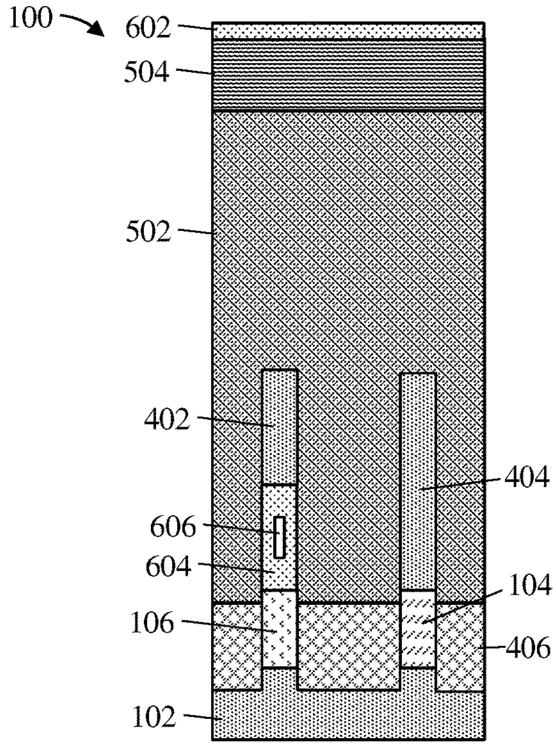
FIG. 7D Y2

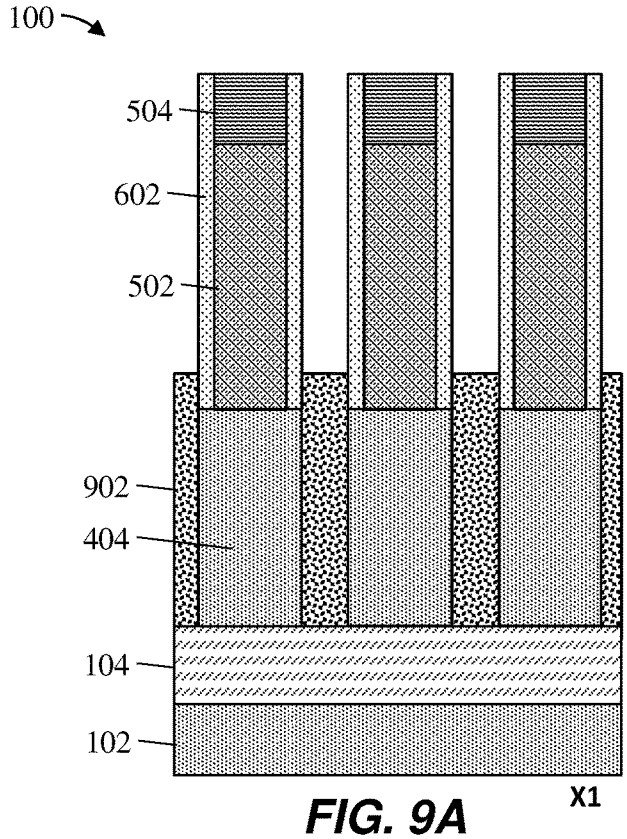
FIG. 9A X1
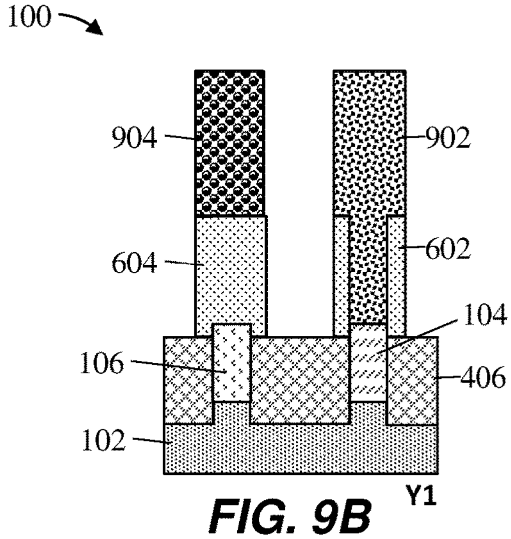
FIG. 9B Y1
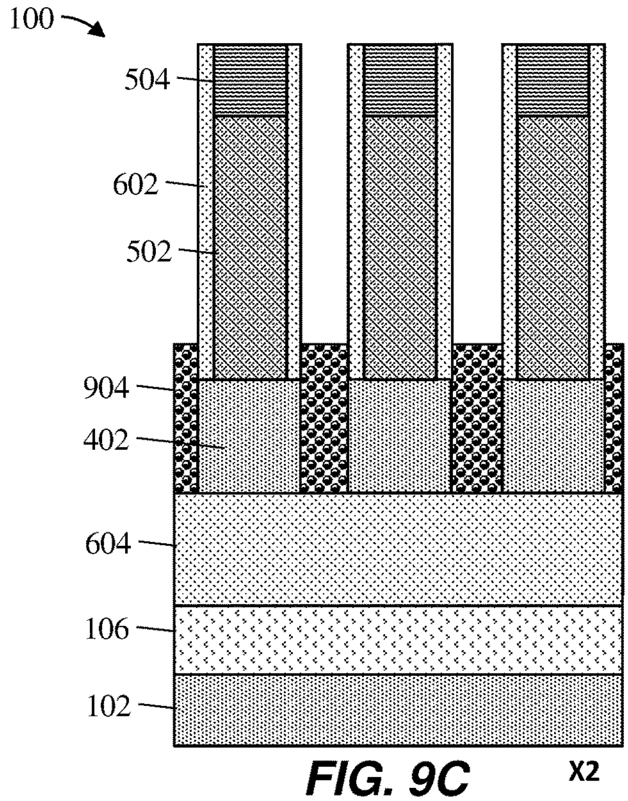
FIG. 9C X2
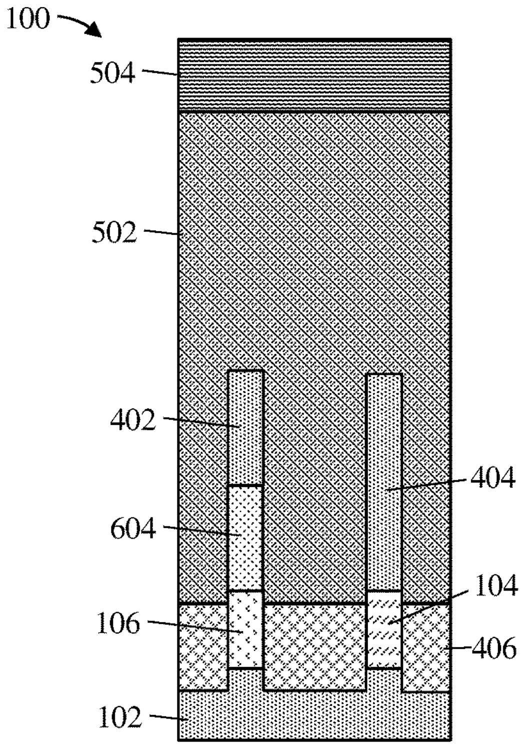
FIG. 9D Y2

1300

FORM A SUBSTRATE WITH AN N-TYPE REGION AND A N-TYPE REGION
1302

FORM A FIRST FIN OVER THE N-TYPE REGION OF THE SUBSTRATE
1304

FORM A SECOND FIN OVER THE P-TYPE REGION OF THE SUBSTRATE
1306

FORM A FIRST BOTTOM DIELECTRIC ISOLATION (BDI) REGION DIRECTLY BETWEEN THE FIRST FIN AND THE N-TYPE REGION OF THE SUBSTRATE
1308

FORM A SECOND BDI REGION DIRECTLY BETWEEN THE SECOND FIN AND THE N-TYPE REGION OF THE SUBSTRATE SUCH THAT A HEIGHT OF THE SECOND BDI REGION IS DIFFERENT THAN A HEIGHT OF THE FIRST BDI REGION, THEREBY PROVIDING THE FIRST FIN HAVING A FIRST EFFECTIVE WIDTH AND THE SECOND FIN HAVING A SECOND EFFECTIVE WIDTH DIFFERENT THAN THE FIRST EFFECTIVE WIDTH
1310

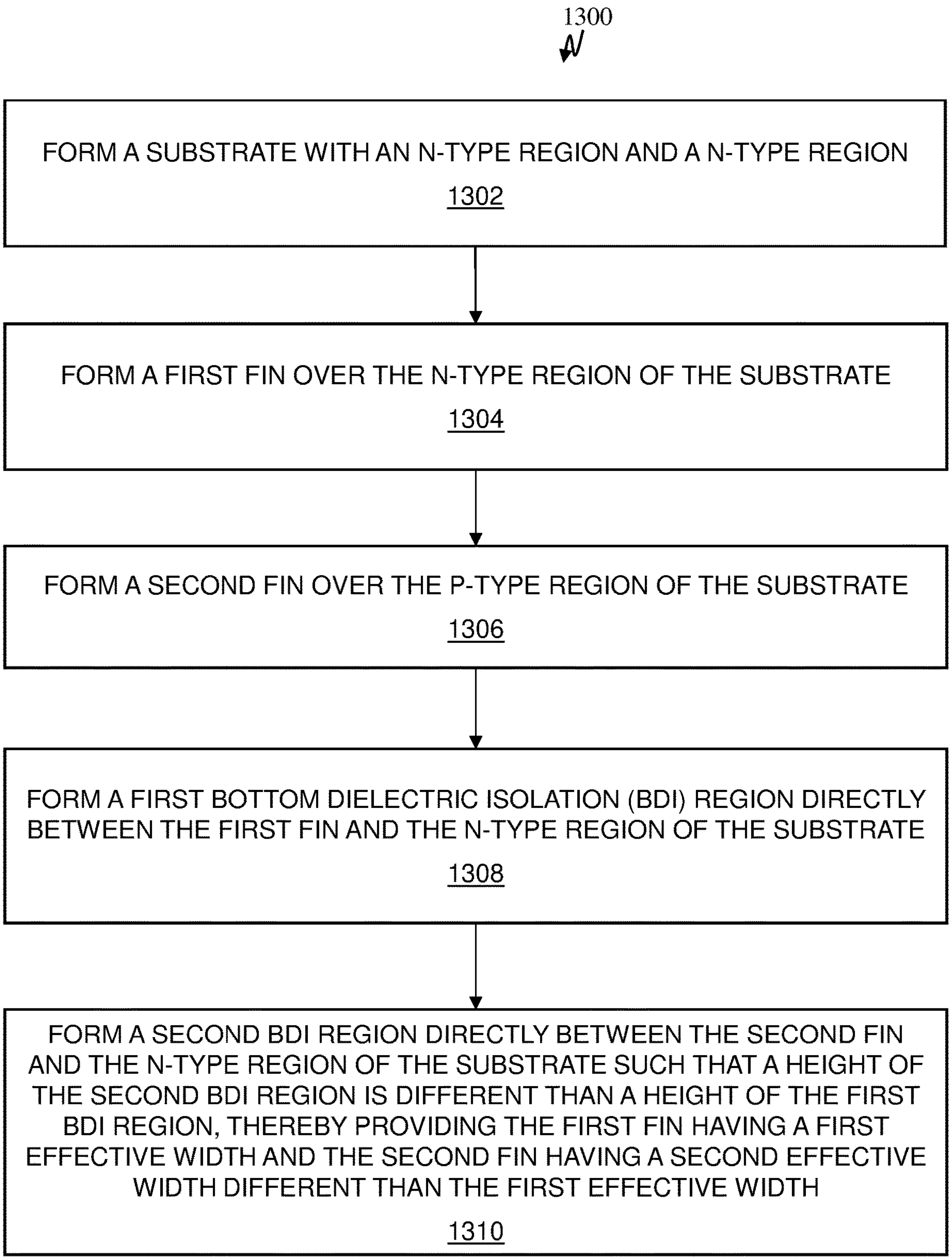

*FIG. 13*

MULTIPLE FIN HEIGHTS FOR EFFECTIVE WIDTH TUNING

BACKGROUND

The present disclosure generally relates to fabrication methods and resulting structures for semiconductor devices, and more specifically, to processing methods and resulting structures for co-integrating multiple fin heights with bottom dielectric isolations for effective width tuning.

A transistor is a semiconductor device used to amplify or switch electrical signals and power and is one of the basic building blocks of modern electronics. A field-effect transistor (FET) is a type of transistor that uses an electric field to control the flow of current in a semiconductor. An FET has three terminals: a source, a gate and a drain. FETs control the flow of current by the application of a voltage to the gate, which in turn alters the conductivity between the drain and the source. A conventional FET is a planar device where the entire channel region of the device is formed parallel and slightly below the planar upper surface of the semiconducting substrate. In contrast to a planar FET, there are so-called three-dimensional (3D) devices, such as a FinFET device. In a FinFET, a fin-like structure extends vertically from the planar upper surface of the semiconducting substrate. This fin, typically made of silicon, serves as the conducting channel between the source and drain terminals, and can provide improved electrostatic control over the gate, minimize subthreshold slope, and reduce leakage currents as compared to planar architectures.

SUMMARY

Embodiments of the present disclosure are directed to a semiconductor structure. A non-limiting example of the semiconductor structure includes a first shallow trench isolation (STI) region formed over a first portion of a substrate and a second STI region formed over a second portion of the substrate. A topmost surface of the second STI region is coplanar to a topmost surface of the first STI region. A first fin is formed in the first STI region and a second fin is formed in the second STI region. A topmost surface of the second fin is coplanar to a topmost surface of the first fin. A bottom dielectric isolation (BDI) region is positioned between the first fin and the substrate, thereby providing a first effective width and a second effective width for the first fin and second fin, respectively.

Embodiments of the present disclosure are directed to a semiconductor structure. A non-limiting example of the semiconductor structure includes a substrate having an n-type region and a p-type region. A first fin is formed over the n-type region of the substrate and a second fin is formed over the p-type region of the substrate. A first BDI region is positioned directly between the first fin and the n-type region of the substrate and a second BDI region is positioned directly between the second fin and the p-type region of the substrate. A height of the second BDI region is different than a height of the first BDI region, such that the effective height of the second fin is different from the effective height of the first fin.

Embodiments of the present disclosure are directed to a semiconductor structure. A non-limiting example of the semiconductor structure includes a plurality of fins formed over a substrate. The plurality of fins includes a first fin having a first height, a second fin having a second height different than the first height, and a third fin having a third height different than the first height and the second height.

A gate is formed over the first fin, the second fin, and the third fin. An effective width of the first fin is less than an effective width of the second fin and the effective width of the second fin is less than an effective width of the third fin.

Embodiments of the present disclosure are directed to a method for co-integrating multiple fin heights with bottom dielectric isolations for effective width tuning. A non-limiting example of the method includes forming a first STI region over a first portion of a substrate and forming a second STI region over a second portion of the substrate. A topmost surface of the second STI region is coplanar to a topmost surface of the first STI region. The method includes forming a first fin in and above the first STI region and forming a second fin in and above the second STI region. A topmost surface of the second fin is coplanar to a topmost surface of the first fin. The method includes forming a BDI region directly between the first fin and the substrate, thereby providing the first fin having a first effective width and the second fin having a second effective width different than the first effective width.

Embodiments of the present disclosure are directed to a method for co-integrating multiple fin heights with bottom dielectric isolations for effective width tuning. A non-limiting example of the method includes forming a substrate having an n-type region and a p-type region. The method includes forming a first fin over the n-type region of the substrate and forming a second fin over the p-type region of the substrate. The method includes forming a first BDI region directly between the first fin and the n-type region of the substrate and forming a second BDI region directly between the second fin and the p-type region of the substrate. The height of the second BDI region is different than the height of the first BDI region, thereby providing the first fin having a first effective width and the second fin having a second effective width different than the first effective width.

Additional technical features and benefits are realized through the techniques of the present disclosure. Embodiments and aspects of the present disclosure are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the present disclosure are apparent from the following detailed description taken in conjunction with the accompanying drawings in which:

FIGS. 7A, 7B, 7C, and 7D depict cross-sectional views taken along the lines X1, Y1, X2, and Y2, respectively, in FIG. 1A after a processing operation according to one or more embodiments;

FIGS. 9A, 9B, 9C, and 9D depict cross-sectional views taken along the lines X1, Y1, X2, and Y2, respectively, in FIG. 1A after a processing operation according to one or more embodiments;

FIG. 13 depicts a flow diagram illustrating a method according to one or more embodiments.

Figure 1A:
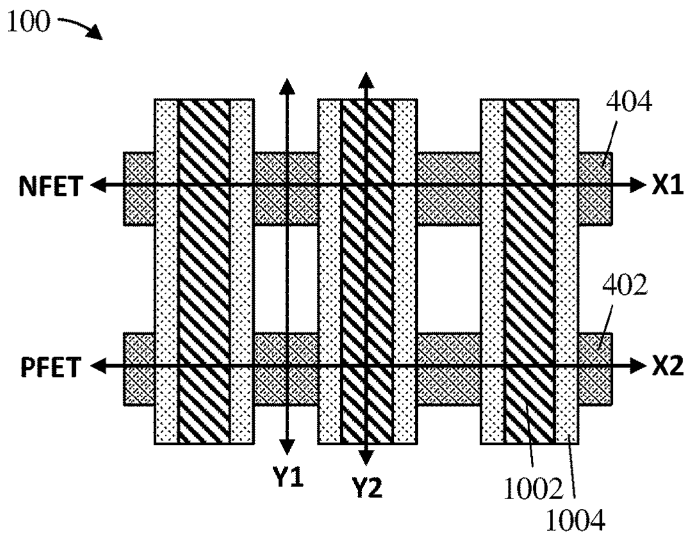
FIG. 1A depicts a top-down reference view of a semiconductor wafer after forming a number of fins and gates during a set of fabrication operations according to one or more embodiments.

The diagrams depicted herein are illustrative. There can be many variations to the diagram or the operations described therein without departing from the spirit of the present disclosure. For instance, the actions can be performed in a differing order or actions can be added, deleted or modified.

In the accompanying figures and following detailed description of the described embodiments of the present disclosure, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the present disclosure are described in connection with a particular transistor architecture, embodiments of the present disclosure are not limited to the particular transistor architectures or materials described in this specification. Rather, embodiments of the present disclosure are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present disclosure, ICs are fabricated in a series of stages, including a front-end-of-line (FEOL) stage, a middle-of-line (MOL) stage, and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., CA) and other structures that communicatively couple to active regions (e.g., gate, source, and drain) of the device element. For example, the silicidation of source/drain regions, as well as the deposition of metal contacts, can occur during the MOL stage to connect the elements patterned during the FEOL stage. Layers of interconnections (e.g., metallization layers) are formed above these logical and functional layers during the BEOL stage to complete the IC. Most ICs need more than one layer of wires to form all the necessary connections, and as many as 5-12 layers are added in the BEOL process. The various BEOL layers are interconnected by vias that couple from one layer to another. Insulating dielectric materials are used throughout the layers of an IC to perform a variety of functions, including stabilizing the IC structure and providing electrical isolation of the IC elements. For example, the metal interconnecting wires in the BEOL region of the IC are isolated by dielectric layers to prevent the wires from creating a short circuit with other metal layers.

As discussed previously, the FEOL involves the fabrication of a number of transistors and other devices on a semiconductor substrate/wafer. During this time a number of parameters and/or characteristics of the transistors are defined. For example, the "effective channel width" of a transistor is a parameter defined during the FEOL that plays a large role in determining the ultimate performance of the transistor, particularly in terms of speed, power consumption, and overall efficiency. The effective channel width of a transistor represents the actual channel width through which current flows in the transistor. One of the challenges with current FinFET technology is referred to as "width quantization", which refers to the fact that channel widths are typically two times the respective fin heights, and the fins are usually all the same height. Devices are made up of groups of fins, and having a single fin height means that device designs are natively limited to using discrete channel widths (e.g., 1 fin, 2 fin, 3 fin, etc.).

This disclosure introduces new fabrication methods and resulting structures for co-integrating multiple fin heights with bottom dielectric isolations for effective channel width tuning. Rather than limiting an integrated circuit to transistors having a single effective channel width, aspects of this disclosure introduce transistors having arbitrarily varied effective channel widths on the same wafer substrate. In some embodiments, portions of one or more fins on a substrate are replaced with a bottom dielectric isolation. In some embodiments, the fins are epitaxially grown in two layers, with the first, base layer being a sacrificial material that is ultimately replaced by the bottom dielectric isolation. The remaining second layer is a semiconductor layer that defines the effective gate width of the respective transistor.

The ratio of the heights of the first (sacrificial) and second (permanent) layers can be separately defined for arbitrary regions of a substrate via masking to create integrated circuits having transistors covering a range of effective channel widths. In this manner, integrated circuits can include high performance regions of transistors having relatively narrower effective channel widths as well as standard regions of transistors having relatively wider effective channel widths. In short, the result is an integrated circuit having fine-grained FinFET width quantization and effective channel widths tuning that enables circuit scaling without pitch scaling.

Advantageously, co-integrating multiple fin heights for effective channel width tuning in accordance with one or more embodiments allows for devices to be made with many different combinations of fin heights, offering a solution to width quantization. One benefit is found in the area scaling of devices. Consider, for example, an architecture that requires an NFET width to be two times the PFET width. If all fin widths are the same, this type of design requires a minimum of two NFET fins and one PFET fin. Conversely, width tuning as described herein allows for the PFET fin to be made at half the height of the NFET fin, meaning that only a single NFET fin and a single PFET fin are required for the device—a significant benefit in the area footprint of the device. Other advantages are possible, including devices having fractional effective channel widths (e.g., one fin at full height and a second fin at half height for an effective 1.5 width).

Figure 1B:
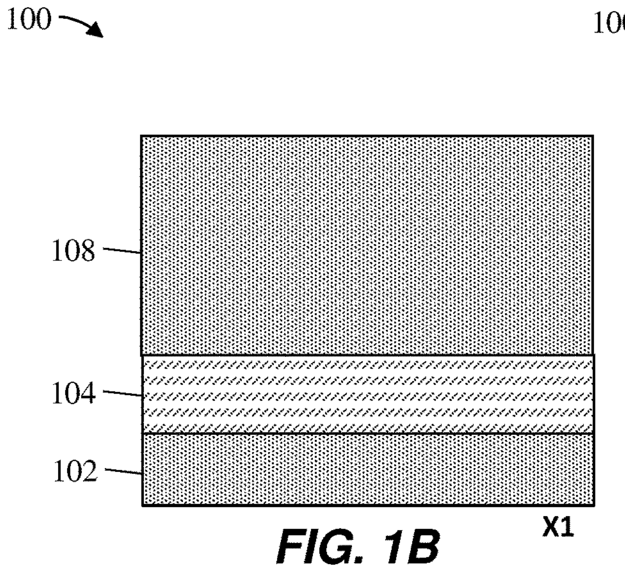
FIGS. 1B and 1C depict cross-sectional views taken along the lines X1 (across gate in an n-type region) and X2 (across gate in a PFET region), respectively, in FIG. 1A after an initial set of fabrication operations according to one or more embodiments.
Figure 1C:
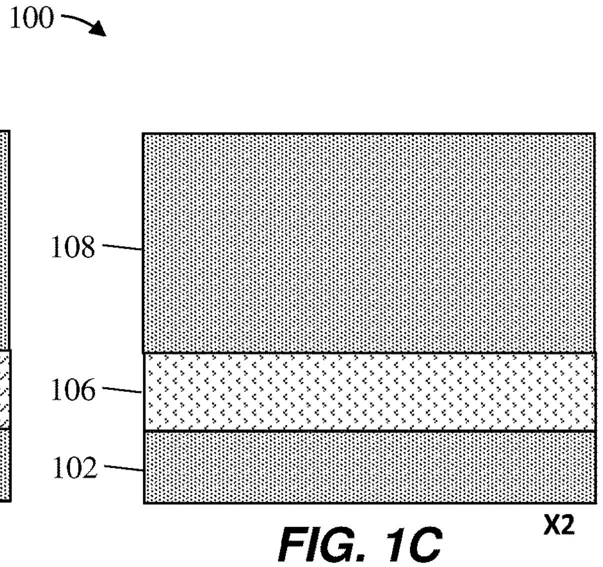

Turning now to a more detailed description of fabrication operations and resulting structures according to aspects of the present disclosure, FIG. 1A depicts a top-down reference view of a semiconductor wafer 100 after forming a number of fins and gates during a set of fabrication operations of a method of fabricating a final semiconductor device according to one or more embodiments of the present disclosure. FIG. 1B depicts a cross-sectional view taken along the line X1 (across gate in an n-type region, also referred to as an n-type punch through stopper region, or N-PTS) in FIG. 1A after an initial set of fabrication operations (prior to forming the fins/gate as shown in FIG. 1A) according to one or more embodiments of the present disclosure. FIG. 1C depicts a cross-sectional view taken along the line X2 (across gate in a p-type region, also referred to as a p-type punch through stopper region, or P-PTS) in FIG. 1A after the initial set of fabrication operations.

At the fabrication stage depicted in FIGS. 1B and 1C, known fabrication operations have been used to form a substrate 102, a p-type punch-through-stopper (PTS) implant 104 on the substrate 102 in the n-type region (refer to FIG. 1B), an n-type PTS implant 106 on the substrate 102 in the PFET region (refer to FIG. 1C), and a first semiconductor layer 108 on the p-type PTS implant 104 and the n-type PTS implant 106 (collectively, the PTS implants 104/106). In some embodiments, the substrate 102 is an incoming bulk substrate, the p-type PTS implant 104 and the n-type PTS implant 106 are formed by implanting dopants into the substrate 102, and the first semiconductor layer 108 is epitaxially grown on the PTS implants 104/106.

The substrate 102, p-type PTS implant 104, n-type PTS implant 106, and first semiconductor layer 108 can be made of any suitable semiconductor materials, such as, for example, monocrystal silicon, silicon germanium (SiGe), III-V compound semiconductor, II-VI compound semiconductor, and semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys.

In some embodiments, the substrate 102, p-type PTS implant 104, n-type PTS implant 106, and first semiconductor layer 108 can be made of a same semiconductor material (e.g., silicon), except that the p-type PTS implant 104 further includes p-type dopants and the n-type PTS implant 106 further includes n-type dopants. While the degree of doping is not meant to be particularly limited, in some embodiments, the p-type PTS implant 104 and the n-type PTS implant 106 can be doped to an active doping concentration of $2\times10^{19}/cm^3$ to $8\times10^{21}/cm^3$, respectively, using known doping techniques such as, for example, surface implantation plus an anneal, gas phase doping, etc.

Figure 2A:
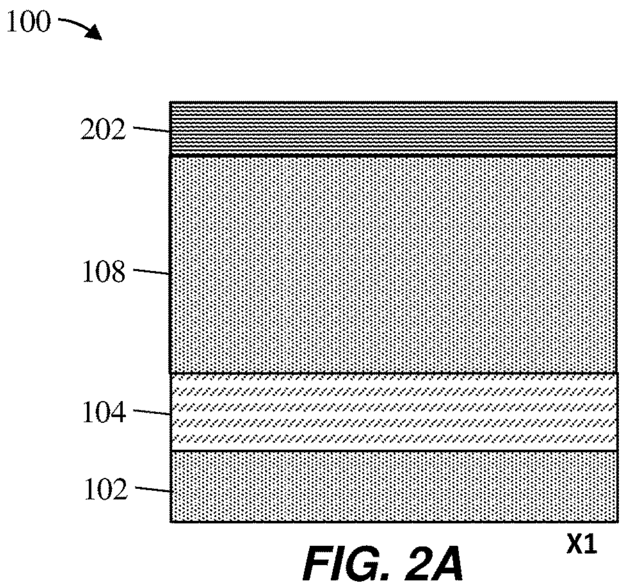
FIGS. 2A, 2B, 2C, and 2D depict cross-sectional views taken along the lines X1, Y1 (across source/drain), X2, and Y2 (along gate), respectively, in FIG. 1A after a processing operation according to one or more embodiments.
Figure 2B:
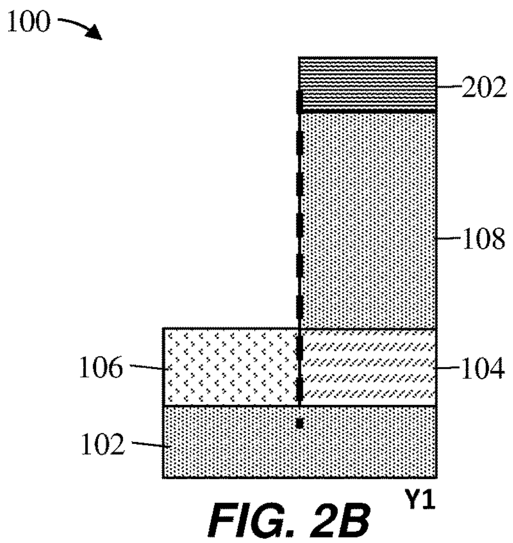
Figure 2C:
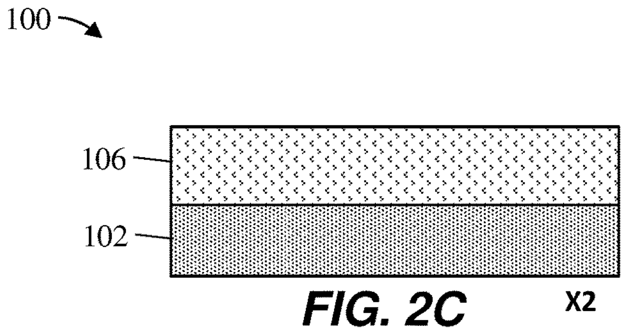
Figure 2D:
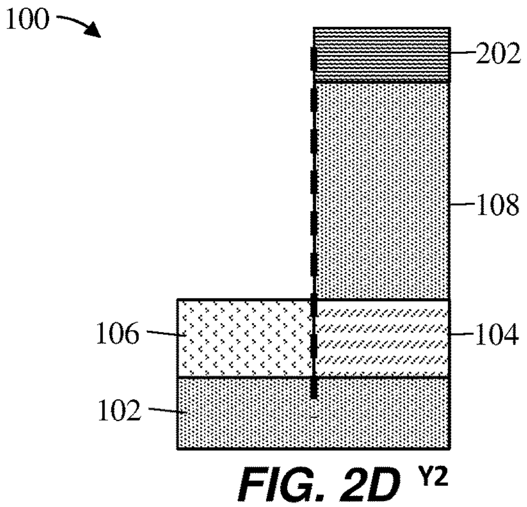

FIG. 2A depicts a cross-sectional view taken along the line X1 (across gate in the n-type region) in FIG. 1A after additional fabrication operations following the initial fabrication operations shown in FIG. 1B according to one or more embodiments of the present disclosure. FIG. 2B depicts a cross-sectional view taken along the line Y1 (across source/drain) in FIG. 1A after the additional fabrication operations. FIG. 2C depicts a cross-sectional view taken along the line X2 (across gate in the PFET region) in FIG. 1A after the additional fabrication operations. FIG. 2D depicts a cross-sectional view taken along the line Y2 (along gate) in FIG. 1A after the additional fabrication operations.

As shown in FIGS. 2A-2D, a hard mask 202 is formed over the first semiconductor layer 108 in the n-type region. The hard mask 202 can be formed using any suitable process, such as, for example, CVD, plasma-enhanced CVD (PECVD), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), atomic layer deposition (ALD), flowable CVD, spin-on dielectrics, physical vapor deposition (PVD), molecular beam epitaxy (MBE), chemical solution deposition, spin-on dielectrics, or other like process. The hard mask 202 can be made of any suitable dielectric material, such as, for example, a low-k dielectric, a nitride, silicon nitride, silicon oxide, SiON, SiC, SiOCN, or SiBCN. In some embodiments, the hard mask 202 is a silicon nitride hard mask. The hard mask 202 can be a single layer mask or hard mask stack.

In some embodiments, lithography is utilized to pattern the hard mask 202 as shown, for example, using a patterned photoresist material. In some embodiments, exposed portions of the first semiconductor layer 108 (that is, those portions not covered by the hard mask 202 after patterning) are removed to expose the n-type PTS implant 106. The exposed portions of the first semiconductor layer 108 can be removed using, for example, a wet etch, a dry etch, and/or a combination of wet and/or dry etches. This process can be referred to as an epitaxy etchback.

Figure 3A:
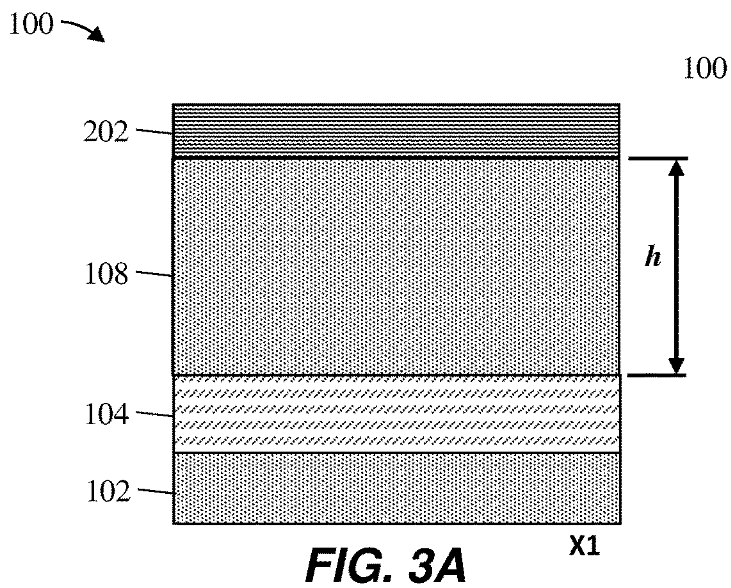
FIGS. 3A, 3B, 3C, and 3D depict cross-sectional views taken along the lines X1, Y1, X2, and Y2, respectively, in FIG. 1A after a processing operation according to one or more embodiments.
Figure 3B:
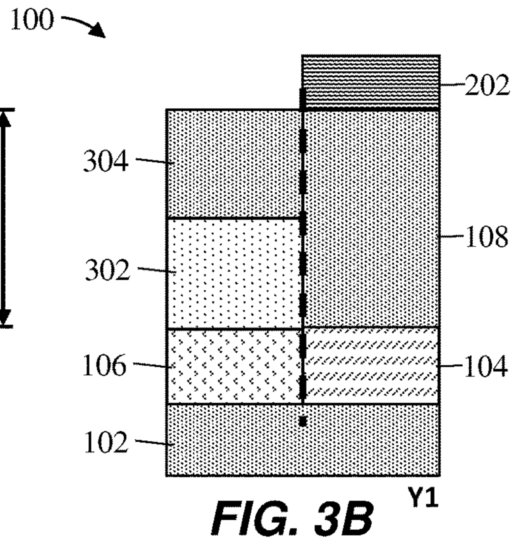
Figure 3C:
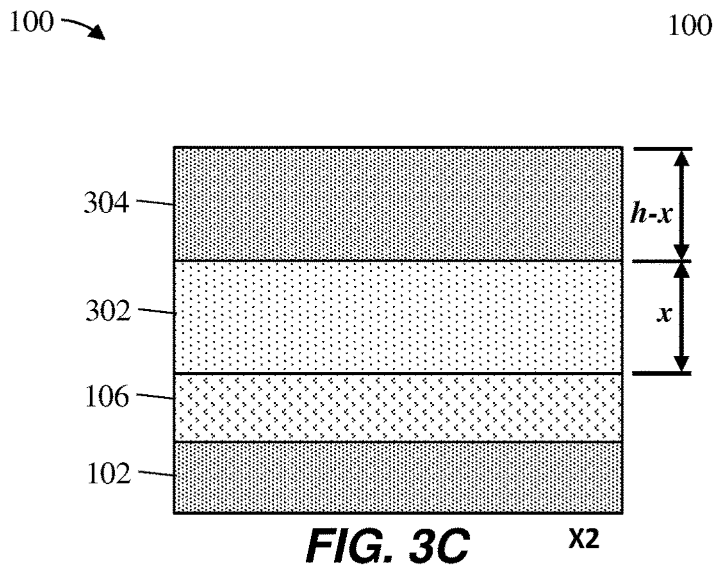
Figure 3D:
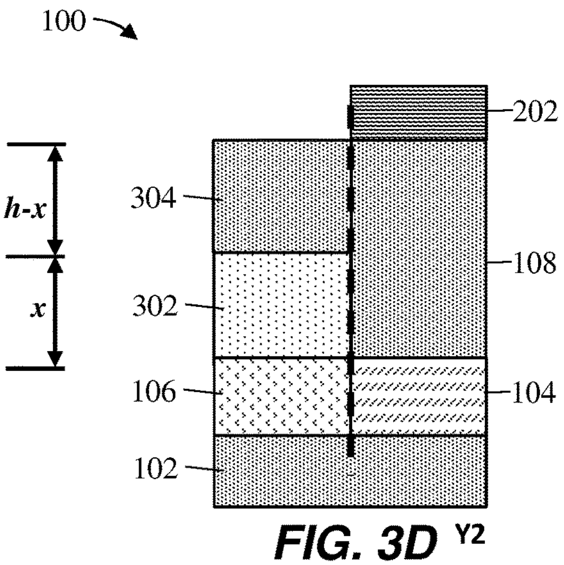

FIG. 3A depicts a cross-sectional view taken along the line X1 (across gate in the n-type region) in FIG. 1A after additional fabrication operations following the fabrication operations shown in FIG. 2A according to one or more embodiments of the present disclosure. FIG. 3B depicts a cross-sectional view taken along the line Y1 (across source/drain) in FIG. 1A after the additional fabrication operations. FIG. 3C depicts a cross-sectional view taken along the line X2 (across gate in the PFET region) in FIG. 1A after the additional fabrication operations. FIG. 3D depicts a cross-sectional view taken along the line Y2 (along gate) in FIG. 1A after the additional fabrication operations.

As shown in FIGS. 3A-3D, a sacrificial layer 302 is formed on the n-type PTS implant 106 in the PFET region. In some embodiments, a second semiconductor layer 304 is formed on the sacrificial layer 302. The second semiconductor layer 304 can be made of a same (e.g., silicon) or different semiconductor material as the first semiconductor layer 108. In some embodiments, the sacrificial layer 302 is made of a material selected to have etch selectivity with respect to the first semiconductor layer 108 and/or the second semiconductor layer 304. For example, if the second semiconductor layer 304 is a silicon layer, the sacrificial layer 302 can be a silicon germanium layer having a germanium concentration of 10 to 90 percent, for example 25 percent.

In some embodiments, the sacrificial layer 302 can be formed to a first height x selected to fix a second height h-x of the second semiconductor layer 304, where h is a height of the first semiconductor layer 108 and x is greater than 0 and less than h. Notably, the ratio of x to h (that is, the Si/SiGe height ratio) can be tuned as needed to target any desired height h-x for the second semiconductor layer 304. For example, x can be 10, 20, 30, 40, 50, 60, 70, 80, 90 percent of h. Moreover, while shown having a single value of x for ease of illustration and discussion, subregions of the substrate 102 can be separately masked and the sacrificial layer 302 can be formed to a plurality of first heights x. In this manner, fins having arbitrarily tuned effective gate widths can be formed over the substrate 102 (refer to FIG. 11).

Figure 4A:
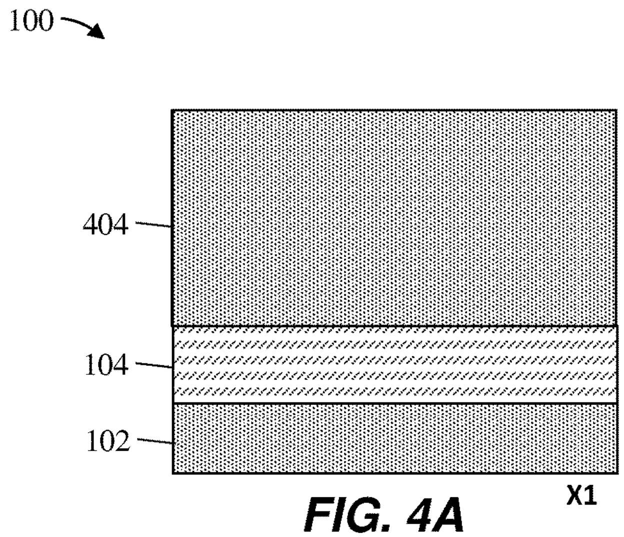
FIGS. 4A, 4B, 4C, and 4D depict cross-sectional views taken along the lines X1, Y1, X2, and Y2, respectively, in FIG. 1A after a processing operation according to one or more embodiments.
Figure 4B:
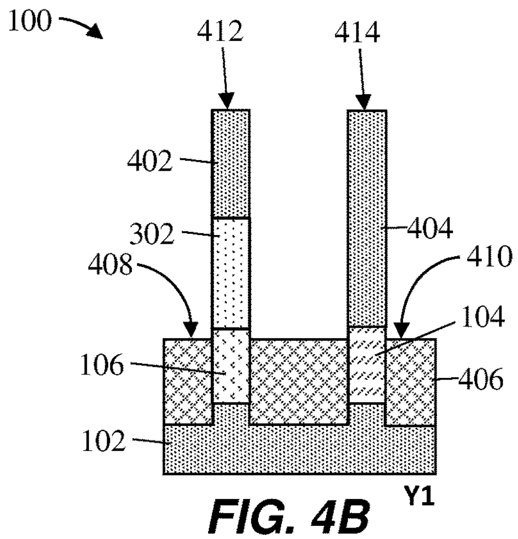
Figure 4C:
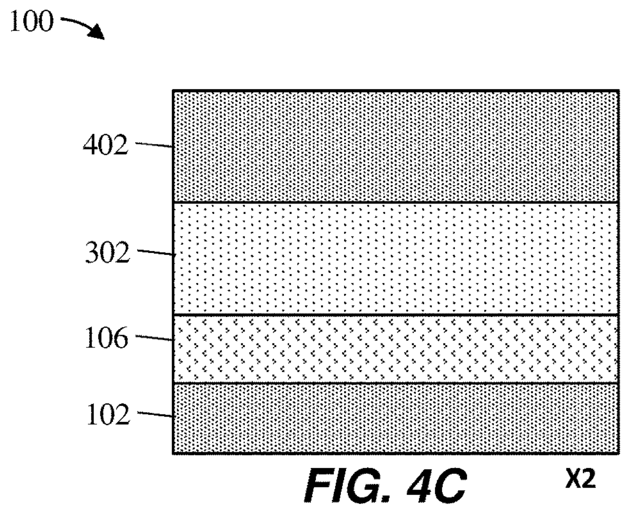
Figure 4D:
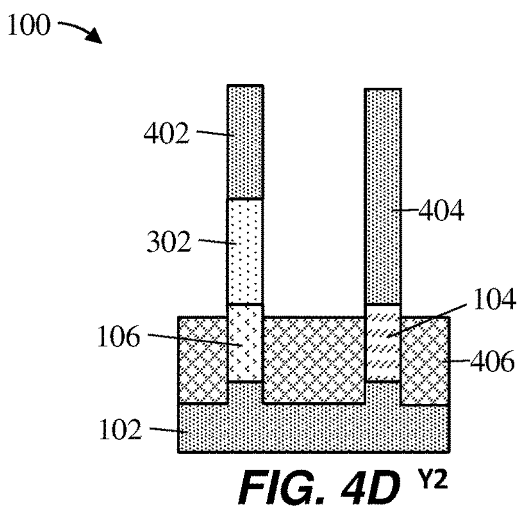

FIG. 4A depicts a cross-sectional view taken along the line X1 (across gate in the n-type region) in FIG. 1A after additional fabrication operations following the fabrication operations shown in FIG. 3A according to one or more embodiments of the present disclosure. FIG. 4B depicts a cross-sectional view taken along the line Y1 (across source/drain) in FIG. 1A after the additional fabrication operations. FIG. 4C depicts a cross-sectional view taken along the line X2 (across gate in the PFET region) in FIG. 1A after the additional fabrication operations. FIG. 4D depicts a cross-sectional view taken along the line Y2 (along gate) in FIG. 1A after the additional fabrication operations.

As shown in FIGS. 4A-4D, the hard mask 202 is removed, first fins 402 are formed in the PFET region, and second fins 404 are formed in the n-type region. In some embodiments, the first fins 402 are formed by patterning the second semiconductor layer 304. The second semiconductor layer 304 can be patterned using a mask (not separately shown) followed by a wet etch, a dry etch, and/or a combination of wet and/or dry etches. For example, the second semiconductor layer 304 can be patterned using a reactive ion etch (RIE). In some embodiments, the pattern is further transferred into the sacrificial layer 302 (refer to FIGS. 4B and 4D). In some embodiments, the second fins 404 are formed by patterning the first semiconductor layer 108. The first semiconductor layer 108 can be patterned in a similar manner as described with respect to the second semiconductor layer 304. Observe that the first fins 402 will have a height of h-x and the second fins 404 will have a height of h (refer to FIGS. 3C and 3A, respectively).

As further shown in FIGS. 4B and 4D, the substrate 102 can be recessed when forming the first fins 402 and second fins 404. In some embodiments, a shallow trench isolation (STI) region 406 can be formed over the substrate 102 after the substrate 102 is recessed. The STI region 406 provides electrical isolation between adjacent devices (e.g., between n-type and PFET devices on the semiconductor wafer 100). The STI region 406 can be formed by forming a trench (not separately shown) in the substrate 102 and filling the trench with dielectric material, such as, for example, a low-k dielectric, an oxide, a nitride, silicon nitride, silicon oxide, SiON, SiC, SiOCN, and SiBCN. Observe that a topmost surface 408 of the STI region 406 in the n-type region (i.e., a first STI region) is coplanar to a topmost surface 410 of the STI region 406 in the PFET region (i.e., a second STI region), even though the first fins 402 and the second fins 404 have different heights. This serves as a physical signature for the processes described herein. Observe further that a topmost surface 412 of first fins 402 is coplanar to a topmost surface 414 of the second fins 404. This serves as an additional physical signature for the processes described herein.

Figure 5A:
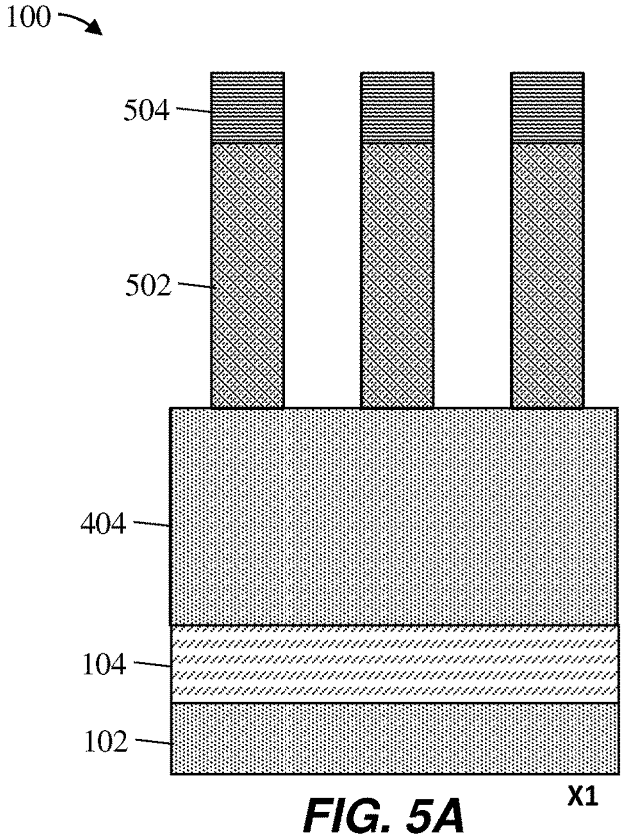
FIGS. 5A, 5B, 5C, and 5D depict cross-sectional views taken along the lines X1, Y1, X2, and Y2, respectively, in FIG. 1A after a processing operation according to one or more embodiments.
Figure 5B:
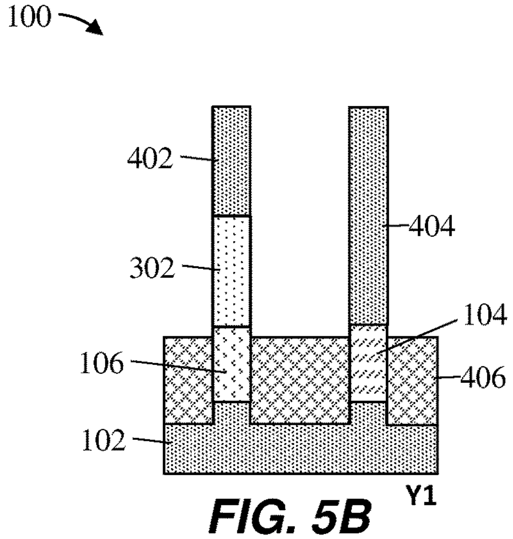
Figure 5C:
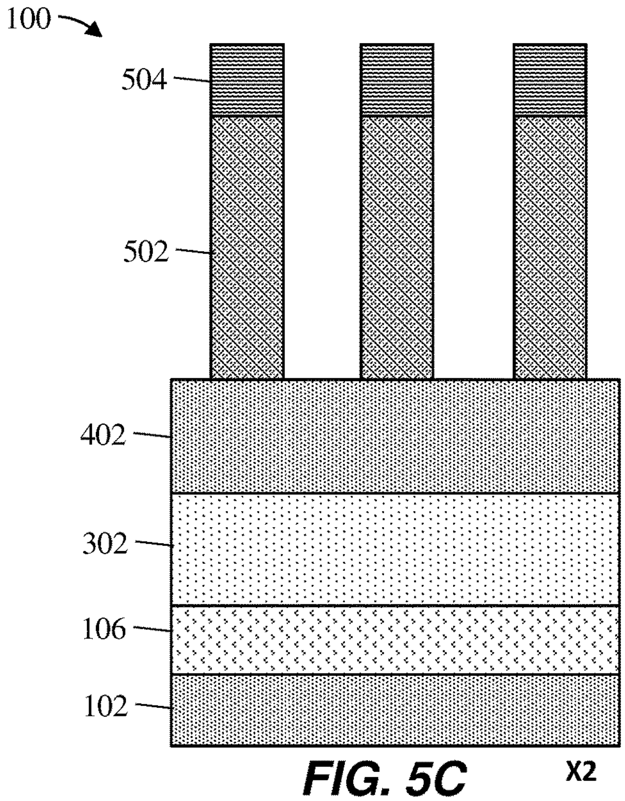
Figure 5D:
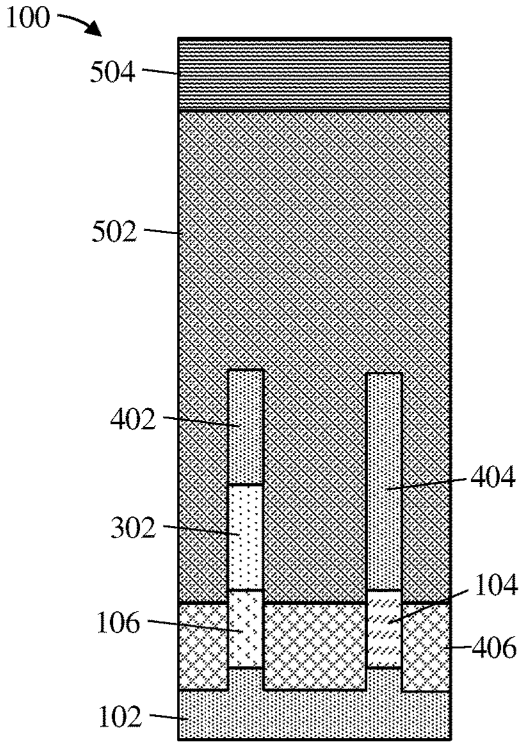

FIG. 5A depicts a cross-sectional view taken along the line X1 (across gate in the n-type region) in FIG. 1A after additional fabrication operations following the fabrication operations shown in FIG. 4A according to one or more embodiments of the present disclosure. FIG. 5B depicts a cross-sectional view taken along the line Y1 (across source/drain) in FIG. 1A after the additional fabrication operations. FIG. 5C depicts a cross-sectional view taken along the line X2 (across gate in the PFET region) in FIG. 1A after the additional fabrication operations. FIG. 5D depicts a cross-sectional view taken along the line Y2 (along gate) in FIG. 1A after the additional fabrication operations.

As shown in FIGS. 5A, 5C, and 5D, a sacrificial gate 502 (also referred to as a dummy gate) can be formed over the first fins 402 and the second fins 404. The sacrificial gate 502 can be made of any suitable material, such as, for example, amorphous silicon or polysilicon. Any known method for patterning a sacrificial gate can be used, such as, for example, a wet etch, a dry etch, or a combination of sequential wet and/or dry etches. In some embodiments, the sacrificial gate 502 is patterned using a hard mask 504, in a similar manner as discussed previously with respect to the hard mask 202.

Figure 6A:
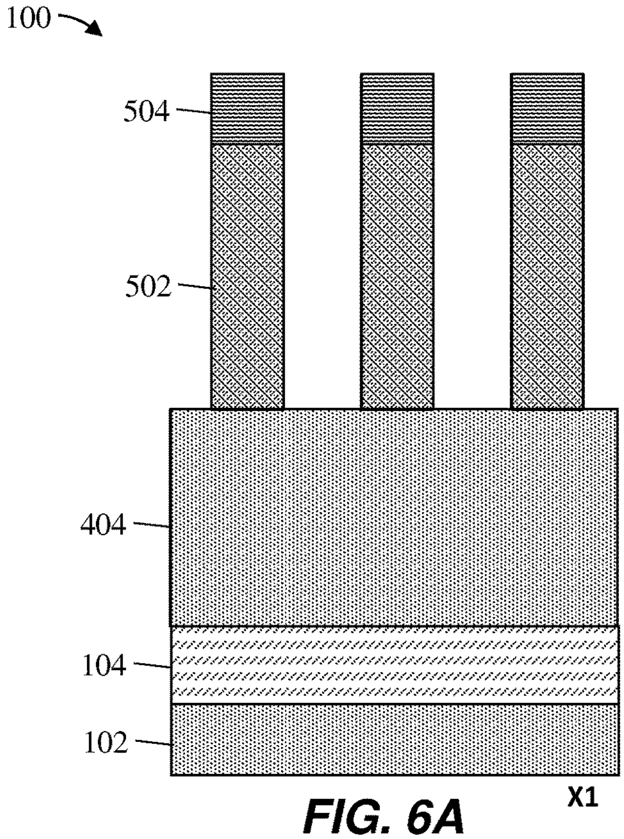
FIGS. 6A, 6B, 6C, and 6D depict cross-sectional views taken along the lines X1, Y1, X2, and Y2, respectively, in FIG. 1A after a processing operation according to one or more embodiments.
Figure 6B:
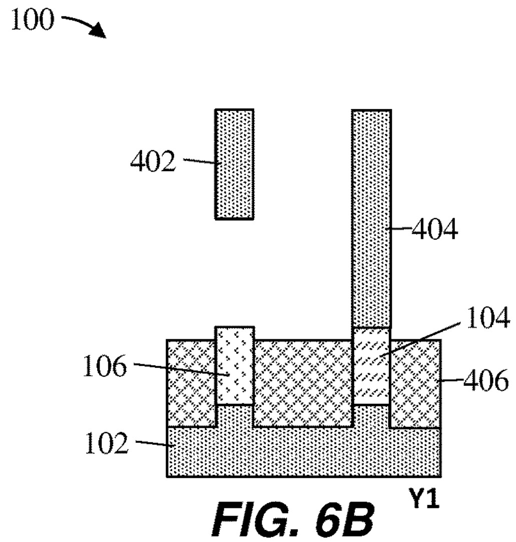
Figure 6C:
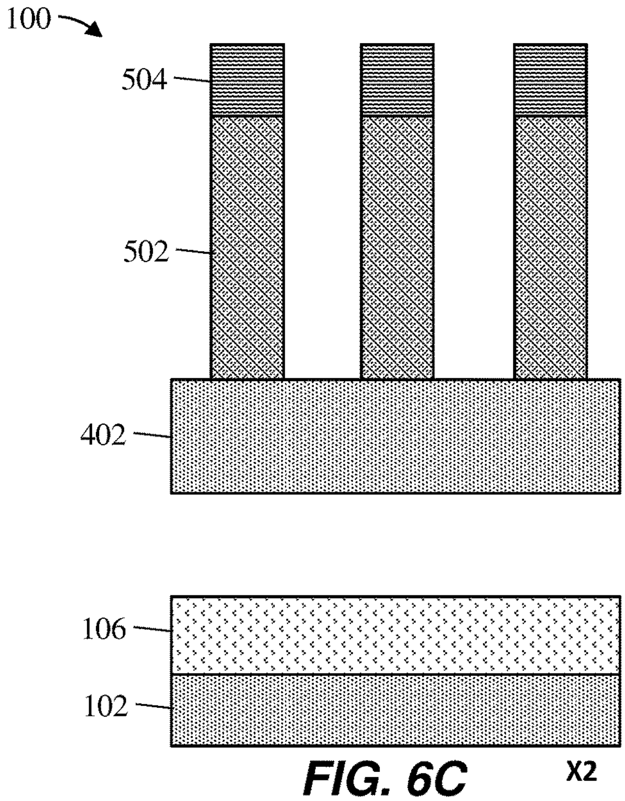
Figure 6D:
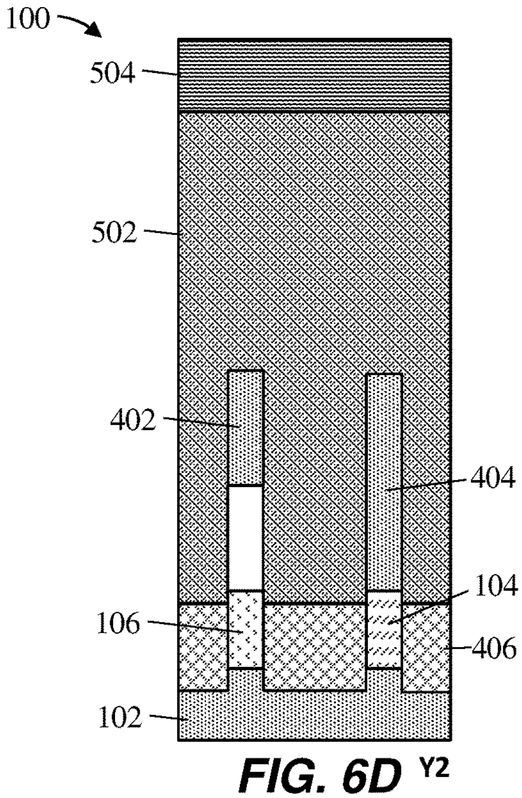

FIG. 6A depicts a cross-sectional view taken along the line X1 (across gate in the n-type region) in FIG. 1A after additional fabrication operations following the fabrication operations shown in FIG. 5A according to one or more embodiments of the present disclosure. FIG. 6B depicts a cross-sectional view taken along the line Y1 (across source/drain) in FIG. 1A after the additional fabrication operations. FIG. 6C depicts a cross-sectional view taken along the line X2 (across gate in the PFET region) in FIG. 1A after the additional fabrication operations. FIG. 6D depicts a cross-sectional view taken along the line Y2 (along gate) in FIG. 1A after the additional fabrication operations.

As shown in FIGS. 6B, 6C, and 6D, the sacrificial layer 302 is removed. In some embodiments, the sacrificial layer 302 is removed selective to the n-type PTS implant 106 and/or the first fins 402. For example, when the first fins 402 are formed of silicon and the sacrificial layer 302 is formed of silicon germanium, hydrogen chloride (HCl) gas, or an aqueous solution containing a mix of ammonia and hydrogen peroxide, can be utilized to remove silicon germanium selective to silicon.

FIG. 7A depicts a cross-sectional view taken along the line X1 (across gate in the n-type region) in FIG. 1A after additional fabrication operations following the fabrication operations shown in FIG. 6A according to one or more embodiments of the present disclosure. FIG. 7B depicts a cross-sectional view taken along the line Y1 (across source/drain) in FIG. 1A after the additional fabrication operations. FIG. 7C depicts a cross-sectional view taken along the line X2 (across gate in the PFET region) in FIG. 1A after the additional fabrication operations. FIG. 7D depicts a cross-sectional view taken along the line Y2 (along gate) in FIG. 1A after the additional fabrication operations.

As shown in FIGS. 7A-7D, a spacer 602 is formed over the substrate 102. In some embodiments, the spacer 602 is a conformal spacer. In some embodiments, the spacer 602 (?) is conformally deposited to a thickness of 1 to 10 nm, although other thicknesses are within the contemplated scope of the disclosure. The spacer 602 can be made of any suitable dielectric material such as, for example, a low-k dielectric, a nitride, silicon nitride, silicon oxide, SiON, SiC, SiOCN, or SiBCN. In some embodiments, the spacer 602 is made of SiOCN.

As further shown in FIGS. 7A-7D, depositing dielectric material for forming the spacer 602 also results in forming a bottom dielectric isolation (BDI) 604. Observe that the BDI 604 replaces the previously removed sacrificial layer 302 (refer to FIGS. 6B, 6C, and 6D). In some embodiments, the spacer 602 and BDI 604 are formed using a deposition-etchback-deposition sequence to prevent the spacer 602 from pinching off prior to the BDI 604. In some embodiments, an air gap 606 (also referred to as an air seam or seam) remains in the BDI 604 following the dielectric deposition process. The air gap 606, if present, serves as a physical signature of the process described herein.

Figure 8A:
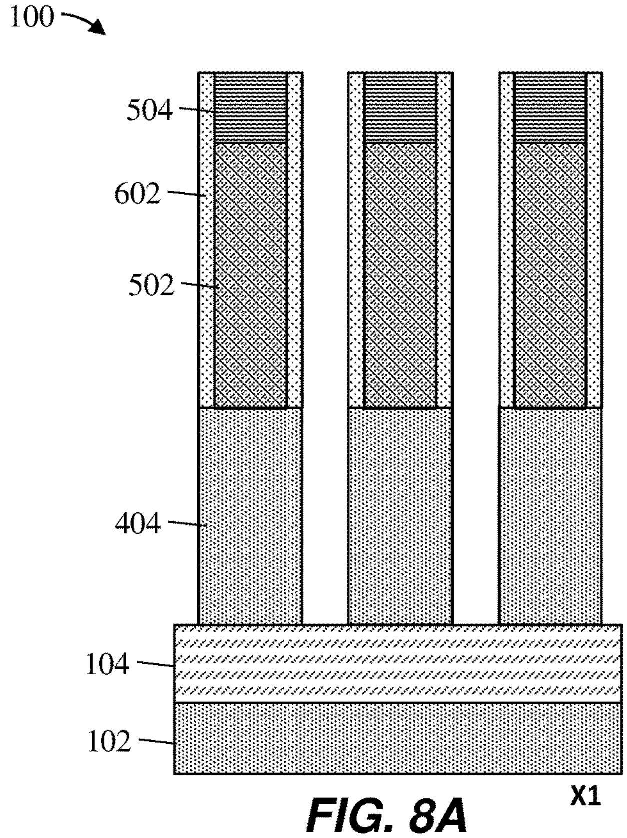
FIGS. 8A, 8B, 8C, and 8D depict cross-sectional views taken along the lines X1, Y1, X2, and Y2, respectively, in FIG. 1A after a processing operation according to one or more embodiments.
Figure 8B:
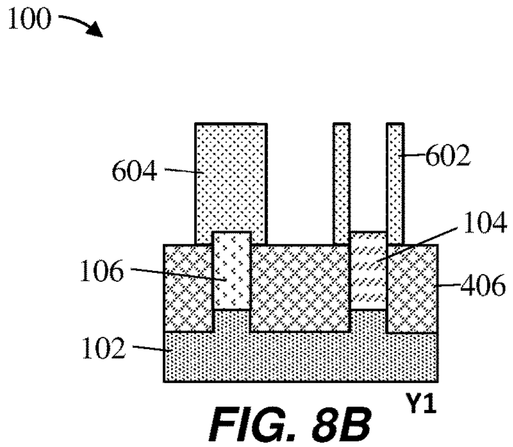
Figure 8C:
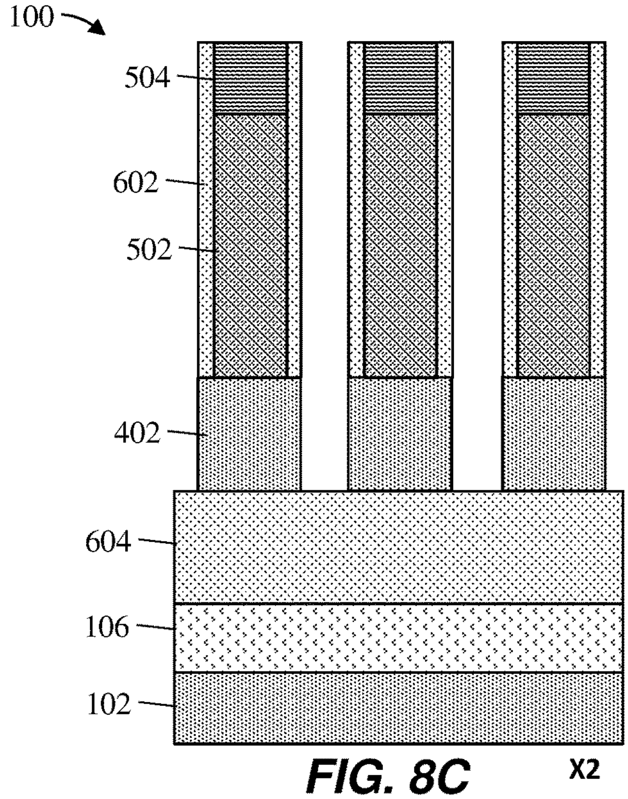
Figure 8D:
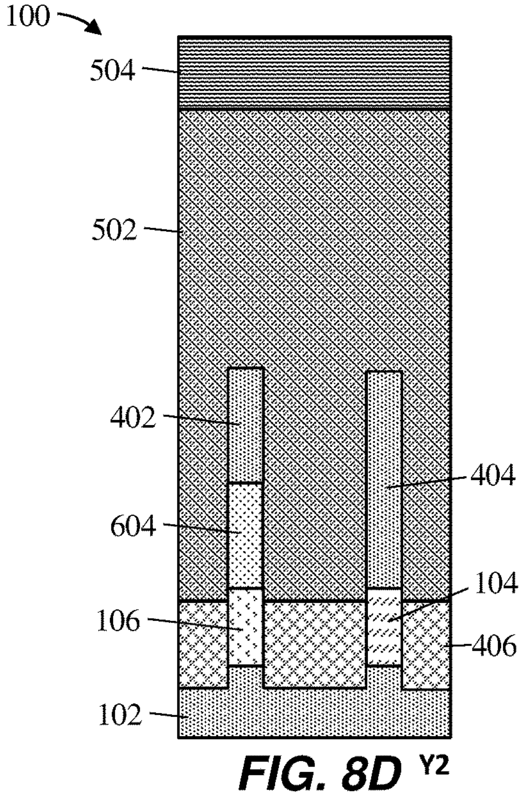

FIG. 8A depicts a cross-sectional view taken along the line X1 (across gate in the n-type region) in FIG. 1A after additional fabrication operations following the fabrication operations shown in FIG. 7A according to one or more embodiments of the present disclosure. FIG. 8B depicts a cross-sectional view taken along the line Y1 (across source/drain) in FIG. 1A after the additional fabrication operations. FIG. 8C depicts a cross-sectional view taken along the line X2 (across gate in the PFET region) in FIG. 1A after the additional fabrication operations. FIG. 8D depicts a cross-sectional view taken along the line Y2 (along gate) in FIG. 1A after the additional fabrication operations. Observe that the potential air gap 606 is omitted for simplicity.

As shown in FIGS. 8A-8D, the first fins 402 and the second fins 404 can be patterned to expose a surface of the p-type PTS implant 104 (refer to FIGS. 8A and 8B) and a surface of the BDI 604 (refer to FIGS. 8B and 8C). The first fins 402 and the second fins 404 can be patterned using, for example, a wet etch, a dry etch, and/or a combination of wet and/or dry etches. In some embodiments, the first fins 402 and the second fins 404 are patterned using an anisotropic spacer etch of the spacer 602 followed by a fin recess (e.g., a RIE).

FIG. 9A depicts a cross-sectional view taken along the line X1 (across gate in the n-type region) in FIG. 1A after additional fabrication operations following the fabrication operations shown in FIG. 8A according to one or more embodiments of the present disclosure. FIG. 9B depicts a cross-sectional view taken along the line Y1 (across source/drain) in FIG. 1A after the additional fabrication operations. FIG. 9C depicts a cross-sectional view taken along the line X2 (across gate in the PFET region) in FIG. 1A after the additional fabrication operations. FIG. 9D depicts a cross-sectional view taken along the line Y2 (along gate) in FIG. 1A after the additional fabrication operations.

As shown in FIGS. 9A-9D, a first source/drain (S/D) region 902 is formed in the n-type region and a second S/D region 904 is formed in the PFET region. The S/D regions 902, 904 can be epitaxially grown using, for example, vapor-phase epitaxy (VPE), molecular beam epitaxy (MBE), liquid-phase epitaxy (LPE), or other suitable processes. The S/D regions 902, 904 can be semiconductor materials epitaxially grown from gaseous or liquid precursors. In some embodiments, the gas source for the epitaxial deposition of semiconductor material includes a silicon containing gas source, a germanium containing gas source, or a combination thereof. For example, a silicon layer can be epitaxially deposited (or grown) from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. A germanium layer can be epitaxially deposited from a germanium gas source that is selected from the group consisting of germane, digermane, halogermane, dichlorogermane, trichlorogermane, tetrachlorogermane and combinations thereof. A silicon germanium alloy layer can be epitaxially formed utilizing a combination of such gas sources. Carrier gases like hydrogen, nitrogen, helium and argon can be used. In some embodiments, the epitaxial semiconductor materials include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Epitaxially grown silicon and silicon germanium can be doped by adding n-type dopants (e.g., P or As) or p-type dopants (e.g., Ga, B, $BF_2$, or Al) as desired. In some embodiments, the S/D regions 902 are n-type source and/or drain regions while the S/D regions 904 are p-type source and/or drain regions (or vice versa). In some embodiments, the S/D regions 902, 904 can be epitaxially formed and doped by a variety of methods, such as, for example, in-situ doped epitaxy (doped during deposition), doped following the epitaxy, or by implantation and plasma doping. The dopant concentration in the doped regions can range from $1\times10^{19}$ $cm^{-3}$ to $2\times10^{21}$ $cm^{-3}$, or between $1\times10^{20}$ $cm^{-3}$ and $1\times10^{21}$ $cm^{-3}$.

Figure 10A:
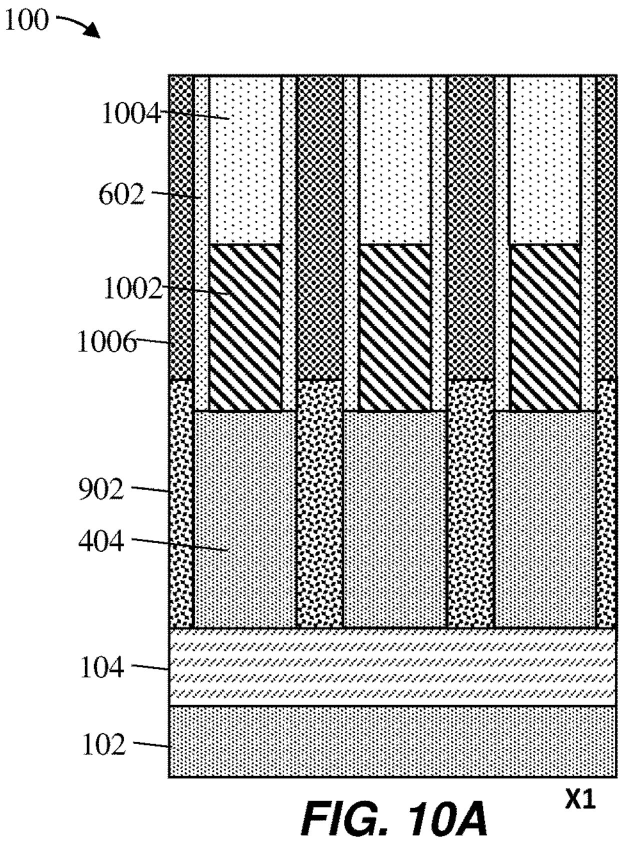
FIGS. 10A, 10B, 10C, and 10D depict cross-sectional views taken along the lines X1, Y1, X2, and Y2, respectively, in FIG. 1A after a processing operation according to one or more embodiments.
Figure 10B:
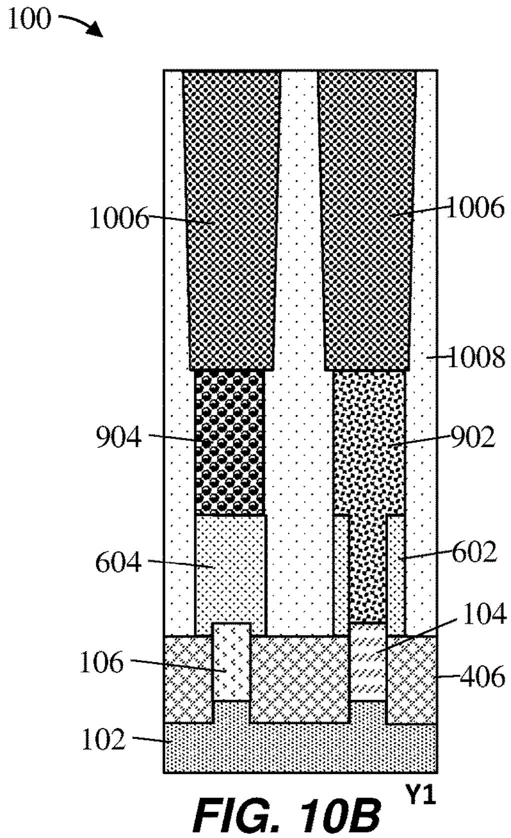
Figure 10C:
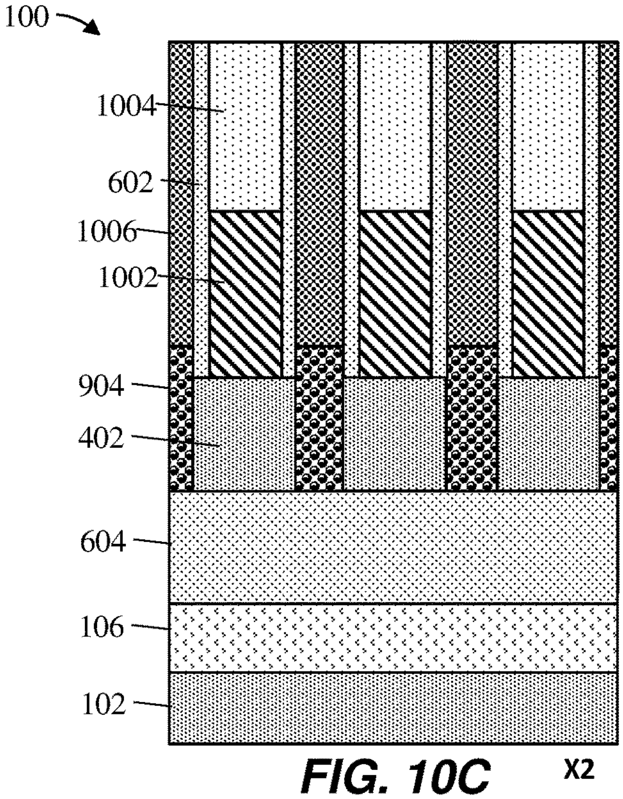
Figure 10D:
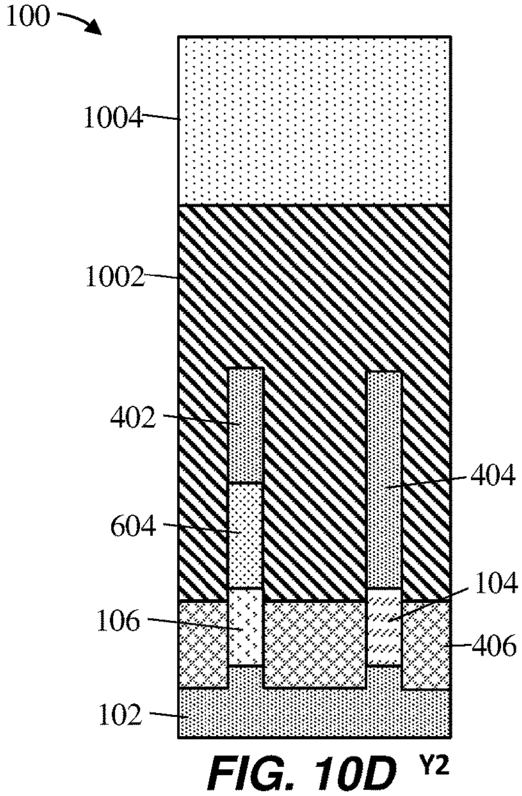

FIG. 10A depicts a cross-sectional view taken along the line X1 (across gate in the n-type region) in FIG. 1A after additional fabrication operations following the fabrication operations shown in FIG. 9A according to one or more embodiments of the present disclosure. FIG. 10B depicts a cross-sectional view taken along the line Y1 (across source/drain) in FIG. 1A after the additional fabrication operations. FIG. 10C depicts a cross-sectional view taken along the line X2 (across gate in the PFET region) in FIG. 1A after the additional fabrication operations. FIG. 10D depicts a cross-sectional view taken along the line Y2 (along gate) in FIG. 1A after the additional fabrication operations.

As shown in FIGS. 10A-10D, the sacrificial gate(s) 502 can be replaced with a conductive gate(s) 1002 (each also referred to as a metal gate, or simply, a gate). The conductive gate 1002 can be a high-k metal gate (HKMG) formed over channel regions of the first fins 402 and the second fins 404 using, for example, known replacement metal gate (RMG) processes, or so-called gate-last processes. As used herein, a "channel region" refers to a portion of the first fins 402 or second fins 404 over which a conductive gate 1002 is formed, and through which current passes from source to drain in the final device. In some embodiments, the conductive gate 1002 can include a gate dielectric and a work function metal stack (not separately depicted).

In some embodiments, the gate dielectric is a high-k dielectric film formed on a surface (sidewall) of the first fins 402 and/or the second fins 404. The high-k dielectric film can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments, the high-k dielectric film can have a thickness of about 0.5 nm to about 4 nm. In some embodiments, the high-k dielectric film includes hafnium oxide and has a thickness of about 1 nm, although other thicknesses are within the contemplated scope of this disclosure.

The work function metal stack, if present, can include one or more work function layers positioned between the high-k dielectric film and a bulk gate material. In some embodiments, the conductive gate 1002 includes one or more work function layers, but does not include a bulk gate material. The work function layers can be made of, for example, aluminum, lanthanum oxide, magnesium oxide, strontium titanate, strontium oxide, titanium nitride, tantalum nitride, hafnium nitride, tungsten nitride, molybdenum nitride, niobium nitride, hafnium silicon nitride, titanium aluminum nitride, tantalum silicon nitride, titanium aluminum carbide, tantalum carbide, and combinations thereof. The work function layers can serve to modify the work function of the conductive gate 1002 and enables tuning of the device threshold voltage. The work function layers can be formed to a thickness of about 0.5 to 6 nm, although other thicknesses are within the contemplated scope of this disclosure. In some embodiments, each of the work function layers can be formed to a different thickness.

In some embodiments, the conductive gate 1002 includes a main body formed from bulk conductive gate material(s) deposited over the work function layers and/or gate dielectrics. The bulk gate material can include any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials. The conductive gate material can further include dopants that are incorporated during or after deposition.

In some embodiments, a dielectric cap 1004 is formed over the conductive gate 1002. The dielectric cap 1004 can be made of any suitable dielectric material, such as, for example, SiN. The dielectric cap 1004 is often referred to as a self-aligned cap (SAC cap), as the dielectric cap 1004 is confined (that is, self-aligned) between sidewalls of the spacer 602.

As further shown in FIGS. 10A-10D, contacts 1006 (as depicted, frontside source/drain contacts) can be formed over the substrate 102. In some embodiments, the contacts 1006 can be formed in or deposited into contact trenches (not separately shown) made in an interlayer dielectric (ILD) 1008 deposited over the substrate 102. In some embodiments, the contacts 1006 provide electrical contact between the S/D regions 902, 904 and other structures on the semiconductor wafer 100, such as an interconnect (not separately shown). Similarly, additional source/drain contacts (not separately shown) can be formed in or deposited into contact trenches to make electrical contact with the conductive gate 1002.

The contacts 1006 can be formed from conductive materials that include copper or a non-copper metal (e.g., tungsten, titanium, tantalum, ruthenium, zirconium, cobalt, aluminum, platinum), alloys thereof, conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments, the contacts 1006 are formed of a same conductive material, for example, cobalt, copper, ruthenium, or tungsten. In some embodiments, the various contacts 1006 are made of different conductive materials. In some embodiments, the contacts 1006 each include a barrier liner (sometimes referred to as a metal liner, or barrier metal liner) to prevent diffusion into surrounding dielectrics (not shown).

After the fabrication operations shown in FIGS. 10A-10D are complete, the semiconductor wafer 100 can be finalized using known processes (e.g., additional FEOL, BEOL, far back end of line (FBEOL), and packaging processes used to define a final device).

Figure 11:
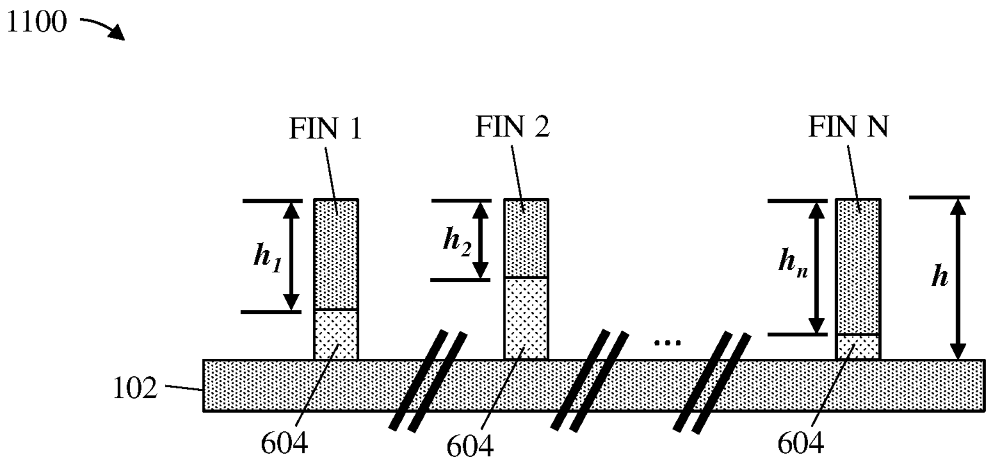
FIG. 11 depicts a cross-sectional view of an example semiconductor wafer having multiple fin height co-integrations in accordance with one or more embodiments.

FIG. 11 depicts a cross-sectional view of an example semiconductor wafer 1100 having multiple fin height co-integrations in accordance with one or more embodiments. As shown in FIG. 11, a plurality of fins (here, FIN 1, FIN 2, . . . , FIN N) are formed over a substrate 102. Observe that FIN 1 has a first height $h_1$, FIN 2 has a second height $h_2$, and FIN N has an $N^{th}$ height $h_n$. Observe further that $h_1 \neq h_2 \neq h_n$. As described previously herein, the heights of the respective fins are defined according to a deposited height of a sacrificial layer (e.g., sacrificial layer 302) that is ultimately replaced by a bottom dielectric isolation (e.g., BDI 604). In this manner, any number of fins having arbitrarily tuned effective gate widths can be formed over the substrate 102. Note that, while each of the fins (e.g., FIN 1, FIN 2, . . . , FIN N) is shown as a single fin for each of illustration and discussion, each of the fins can instead represent a set of fins having a same height. In other words, there can be any number of fins having the first height $h_1$, any number of fins having the second height $h_2$, and any number of fins having the $N^{th}$ height $h_n$.

Figure 12:
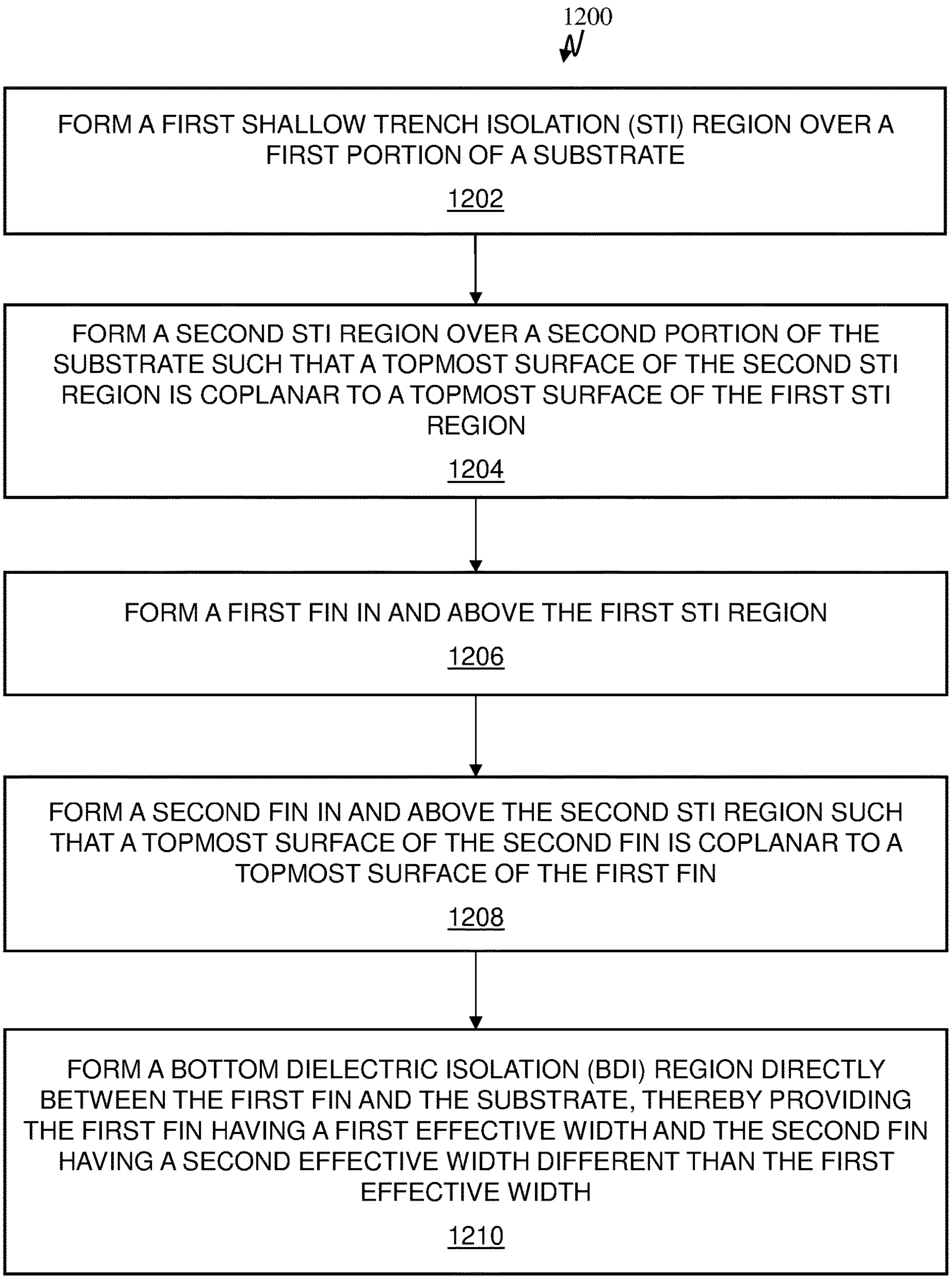
FIG. 12 depicts a flow diagram illustrating a method according to one or more embodiments.

FIG. 12 depicts a flow diagram illustrating a method 1200 for providing semiconductor structures having multiple fin height co-integrations according to one or more embodiments of the present disclosure. The method 1200 is described in reference to FIGS. 1A-11 and may include additional blocks not depicted in FIG. 12. Although depicted in a particular order, the blocks depicted in FIG. 12 can be rearranged, subdivided, and/or combined.

As shown at block 1202, the method includes forming a first STI region over a first portion of a substrate.

As shown at block 1204, the method includes forming a second STI region over a second portion of the substrate. A topmost surface of the second STI region is coplanar to a topmost surface of the first STI region.

As shown at block 1206, the method includes forming a first fin in and above the first STI region.

As shown at block 1208, the method includes forming a second fin in and above the second STI region. A topmost surface of the second fin is coplanar to a topmost surface of the first fin.

As shown at block 1210, the method includes forming a BDI region directly between the first fin and the substrate, thereby providing the first fin having a first effective width and the second fin having a second effective width different than the first effective width.

In some embodiments, the BDI region is directly on the topmost surface of the first STI region.

In some embodiments, the method includes forming an air gap within the BDI region.

In some embodiments, the method includes forming a first S/D region in direct contact with the second fin and a second S/D region in direct contact with the first fin. In some embodiments, the second S/D region is directly on the BDI region.

FIG. 13 depicts a flow diagram illustrating a method 1300 for providing semiconductor structures having multiple fin height co-integrations according to one or more embodiments of the present disclosure. The method 1300 is described in reference to FIGS. 1A-11 and may include additional blocks not depicted in FIG. 13. Although depicted in a particular order, the blocks depicted in FIG. 13 can be rearranged, subdivided, and/or combined.

As shown at block 1302, the method includes forming a substrate having an n-type region and a p-type region.

As shown at block 1304, the method includes forming a first fin over the n-type region of the substrate.

As shown at block 1306, the method includes forming a second fin over the p-type region of the substrate.

As shown at block 1308, the method includes forming a first BDI region directly between the first fin and the n-type region of the substrate.

As shown at block 1310, the method includes forming a second BDI region directly between the second fin and the p-type region of the substrate. A height of the second BDI region is different than a height of the first BDI region.

In some embodiments, the first BDI region is directly on the n-type region of the substrate and the second BDI region is directly on the p-type region of the substrate.

In some embodiments, the method includes forming an air gap within at least one of the first BDI region and the second BDI region.

In some embodiments, the method includes forming a first S/D region in direct contact with the second fin and a second S/D region in direct contact with the first fin.

In some embodiments, the first S/D region is directly on the second BDI region and the second S/D region is directly on the first BDI region.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present disclosure are described herein with reference to the related drawings. Alternative embodiments can be devised without departing from the scope of this disclosure. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present disclosure is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of +8% or 5%, or 2% of a given value.

The phrase "selective to," such as, for example, "a first element selective to a second element," means that the first element can be etched and the second element can act as an etch stop (i.e., the second element remains).

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a <100> orientated crystalline surface can take on a <100> orientation. In some embodiments of the present disclosure, epitaxial growth and/or deposition processes can be selective to forming on semiconductor surface, and may or may not deposit material on other exposed surfaces, such as silicon dioxide or silicon nitride surfaces.

As used herein, "p-type" refers to the addition of impurities to an intrinsic semiconductor that creates deficiencies of valence electrons. In a silicon-containing substrate, examples of p-type dopants, i.e., impurities, include but are not limited to, boron, aluminum, gallium, and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present disclosure will now be provided. Although specific fabrication operations used in implementing one or more embodiments of the present disclosure can be individually known, the described combination of operations and/or resulting structures of the present disclosure are unique. Thus, the unique combination of the operations described in connection with the fabrication of a semiconductor device according to the present disclosure utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present disclosure. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present disclosure have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor structure comprising:

a first shallow trench isolation (STI) region formed over a first portion of a substrate;

a second STI region formed over a second portion of the substrate, wherein a topmost surface of the second STI region is coplanar to a topmost surface of the first STI region;

a first fin formed in and above the first STI region;

a second fin formed in and above the second STI region, wherein a topmost surface of the second fin is coplanar to a topmost surface of the first fin; and a bottom dielectric isolation (BDI) region positioned directly between the first fin and the substrate, thereby providing the first fin having a first effective width and the second fin having a second effective width different than the first effective width.

2. The semiconductor structure of claim 1, wherein the BDI region is directly on the topmost surface of the first STI region.

3. The semiconductor structure of claim 1, further comprising an air gap within the BDI region.

4. The semiconductor structure of claim 1, further comprising a first source/drain (S/D) region in direct contact with the second fin and a second S/D region in direct contact with the first fin.

5. The semiconductor structure of claim 4, wherein the second S/D region is directly on the BDI region.

6. A semiconductor structure comprising:

a substrate comprising an n-type region and a p-type region;

a first fin formed over the n-type region of the substrate;

a second fin formed over the p-type region of the substrate;

a first bottom dielectric isolation (BDI) region positioned directly between the first fin and the n-type region of the substrate; and a second BDI region positioned directly between the second fin and the p-type region of the substrate, wherein a height of the second BDI region is different than a height of the first BDI region, thereby providing the first fin having a first effective width and the second fin having a second effective width different than the first effective width.

7. The semiconductor structure of claim 6, wherein the first BDI region is directly on the n-type region of the substrate and the second BDI region is directly on the p-type region of the substrate.

8. The semiconductor structure of claim 6, further comprising an air gap within at least one of the first BDI region and the second BDI region.

9. The semiconductor structure of claim 6, further comprising a first source/drain (S/D) region in direct contact with the second fin and a second S/D region in direct contact with the first fin.

10. The semiconductor structure of claim 9, wherein the first S/D region is directly on the second BDI region and the second S/D region is directly on the first BDI region.

11. A semiconductor structure comprising:

a plurality of fins formed over a substrate, the plurality of fins comprising a first fin comprising a first height, a second fin comprising a second height different than the first height, and a third fin comprising a third height different than the first height and the second height;

a gate formed over the first fin, the second fin, and the third fin;

a first bottom dielectric isolation (BDI) region positioned directly between the first fin and the substrate;

a second BDI region positioned directly between the second fin and the substrate; and a third BDI region positioned directly between the third fin and the substrate;

wherein an effective width of the first fin is less than an effective width of the second fin and the effective width of the second fin is less than an effective width of the third fin.

12. The semiconductor structure of claim 11, wherein topmost surfaces of each fin of the plurality of fins are coplanar.

13. The semiconductor structure of claim 11, further comprising an air gap within at least one of the first BDI region, the second BDI region, and the third BDI region.

14. The semiconductor structure of claim 11, wherein a height of the first BDI region is greater than a height of the second BDI region and the height of the second BDI region is greater than a height of the third BDI region.

15. A method for forming a semiconductor device, the method comprising:

forming a first shallow trench isolation (STI) region over a first portion of a substrate;

forming a second STI region over a second portion of the substrate, wherein a topmost surface of the second STI region is coplanar to a topmost surface of the first STI region;

forming a first fin in and above the first STI region;

forming a second fin in and above the second STI region, wherein a topmost surface of the second fin is coplanar to a topmost surface of the first fin; and forming a bottom dielectric isolation (BDI) region directly between the first fin and the substrate, thereby providing the first fin having a first effective width and the second fin having a second effective width different than the first effective width.

16. The method of claim 15, wherein the BDI region is directly on the topmost surface of the first STI region.

17. The method of claim 15, further comprising forming an air gap within the BDI region.

18. The method of claim 15, further comprising forming a first source/drain (S/D) region in direct contact with the second fin and a second S/D region in direct contact with the first fin.

19. The method of claim 18, wherein the second S/D region is directly on the BDI region.

20. A method for forming a semiconductor device, the method comprising:

forming a substrate comprising an n-type region and a p-type region;

forming a first fin over the n-type region of the substrate;

forming a second fin over the p-type region of the substrate;

forming a first bottom dielectric isolation (BDI) region directly between the first fin and the n-type region of the substrate; and forming a second BDI region directly between the second fin and the p-type region of the substrate, wherein a height of the second BDI region is different than a height of the first BDI region, thereby providing the first fin having a first effective width and the second fin having a second effective width different than the first effective width.

21. The method of claim 20, wherein the first BDI region is directly on the n-type region of the substrate and the second BDI region is directly on the p-type region of the substrate.

22. The method of claim 20, further comprising forming an air gap within at least one of the first BDI region and the second BDI region.

23. The method of claim 20, further comprising forming a first source/drain (S/D) region in direct contact with the second fin and a second S/D region in direct contact with the first fin.

24. The method of claim 23, wherein the first S/D region is directly on the second BDI region and the second S/D region is directly on the first BDI region.

* * * * *